United States Patent
Willats

(10) Patent No.: US 9,194,271 B2
(45) Date of Patent: Nov. 24, 2015

(54) METHOD AND APPARATUS FOR PROVIDING GOOD THERMAL CONTACT BETWEEN AN EXHAUST COMPONENT AND HEAT EXTRACTION COMPONENT

(75) Inventor: Robin Willats, Columbus, IN (US)

(73) Assignee: Faurecia Emissions Control Technologies, USA, LLC, Columbus, IN (US)

( * ) Notice: Subject to any disclaimer, the term of this patent is extended or adjusted under 35 U.S.C. 154(b) by 644 days.

(21) Appl. No.: 13/204,982

(22) Filed: Aug. 8, 2011

(65) Prior Publication Data

US 2012/0048324 A1    Mar. 1, 2012

Related U.S. Application Data

(60) Provisional application No. 61/378,562, filed on Aug. 31, 2010.

(51) Int. Cl.
*H01L 35/28* (2006.01)
*H01L 35/30* (2006.01)
*F01N 5/02* (2006.01)

(52) U.S. Cl.
CPC ............... *F01N 5/025* (2013.01); *H01L 35/30* (2013.01); *Y02T 10/16* (2013.01); *Y10T 29/49377* (2015.01)

(58) Field of Classification Search
CPC ........................... H01L 35/32; H01L 35/30
See application file for complete search history.

(56) References Cited

U.S. PATENT DOCUMENTS

| | | | | |
|---|---|---|---|---|
| 6,020,554 A | * | 2/2000 | Kaminar et al. | 136/246 |
| 6,121,539 A | * | 9/2000 | Johnson et al. | 136/203 |
| 2003/0133492 A1 | * | 7/2003 | Watanabe | 374/179 |
| 2003/0140957 A1 | * | 7/2003 | Akiba | 136/224 |
| 2007/0045044 A1 | * | 3/2007 | Sullivan | 181/268 |
| 2011/0067742 A1 | * | 3/2011 | Bell et al. | 136/204 |

* cited by examiner

Primary Examiner — Jeffrey T Barton
Assistant Examiner — Uyen Tran
(74) Attorney, Agent, or Firm — Carlson, Gaskey & Olds, PC

(57) ABSTRACT

A heat extraction component for an exhaust component is rigidly connected to a cooling tube. The cooling tube is inserted through a hole in the heat extraction component and is brazed or plastically deformed to provide the rigid connection interface.

23 Claims, 2 Drawing Sheets

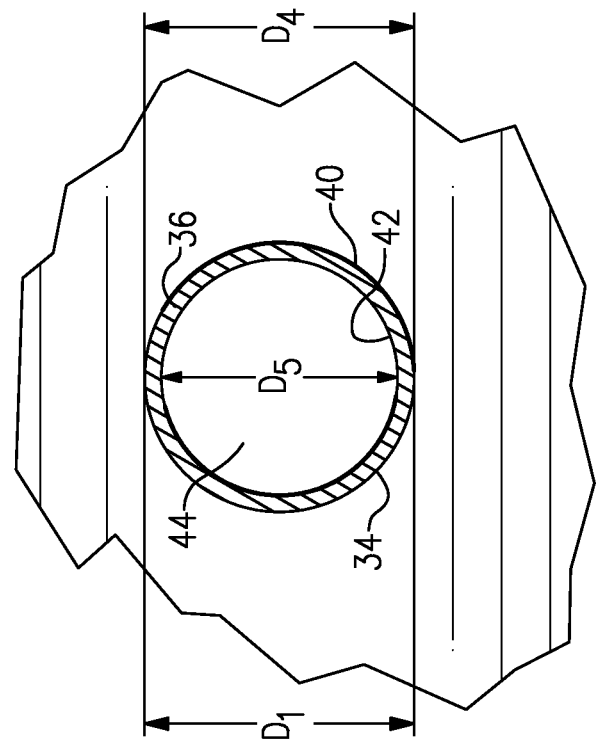
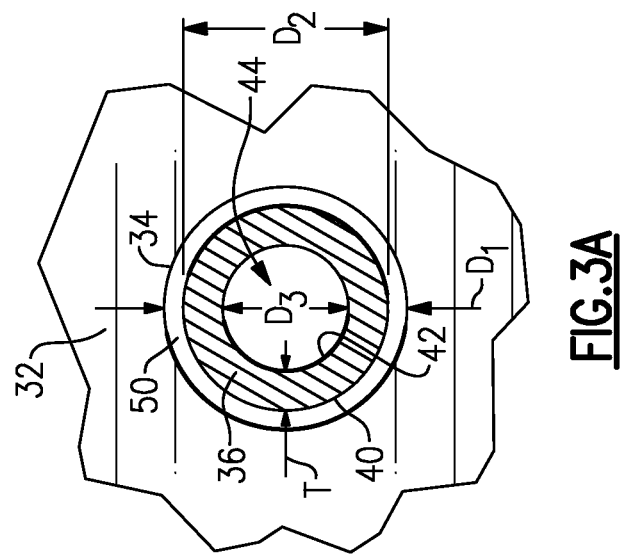

METHOD AND APPARATUS FOR PROVIDING GOOD THERMAL CONTACT BETWEEN AN EXHAUST COMPONENT AND HEAT EXTRACTION COMPONENT

RELATED APPLICATION

This application claims priority to U.S. Provisional Application Ser. No. 61/378,562, which was filed Aug. 31, 2010.

TECHNICAL FIELD

This invention generally relates to providing improved thermal contact between a heat extraction component and an exhaust component, such as a cooling tube for a thermoelectric generator, for example.

BACKGROUND OF THE INVENTION

Some vehicle exhaust systems include a thermoelectric generator (TEG) that utilizes the thermal energy generated by high-temperature exhaust gases to produce electrical power. Traditional thermoelectric generators provide a heat extractor structure that supports a plurality of thermoelectric modules. The thermoelectric modules are configured to convert thermal energy generated by hot exhaust gases to electric energy that can be used or stored to power various vehicle systems.

In certain TEG configurations, a cooling tube is fitted to extend through a plurality of heat extraction fins. Good thermal contact must be maintained between the fins and the tube to ensure a high level of operating efficiency. One known configuration uses thermal grease to maintain thermal contact; however, grease is not considered robust enough for long term durability. Further, thermal grease does not adequately account for tolerances between the position and diameter of location holes formed in the fins compared to the need to insert the cooling tube through multiple fins.

SUMMARY OF THE INVENTION

A heat extraction component for an exhaust component is rigidly connected to a cooling tube.

In one example, the cooling tube is inserted through a hole in the heat extraction component and is brazed to provide the rigid connection interface.

In one example, the cooling tube is inserted through a hole in the heat extraction component and is plastically deformed to provide the rigid connection interface.

In one example, the exhaust component comprises a thermoelectric generator having a housing that encloses the exhaust component. The thermoelectric generator includes at least one thermoelectric module associated with the housing. The thermoelectric module converts thermal energy to electrical power.

These and other features of the present invention can be best understood from the following specification and drawings, the following of which is a brief description.

BRIEF DESCRIPTION OF THE DRAWINGS

FIG. 3A is a cross-sectional view of a cooling tube having an initial diameter prior to forming a rigid connection interface.

FIG. 3B is a cross-sectional view of the cooling tube of FIG. 3A as plastically deformed to provide a final diameter greater than the initial diameter to provide the rigid connection interface.

DETAILED DESCRIPTION OF A PREFERRED EMBODIMENT

Figure 1:
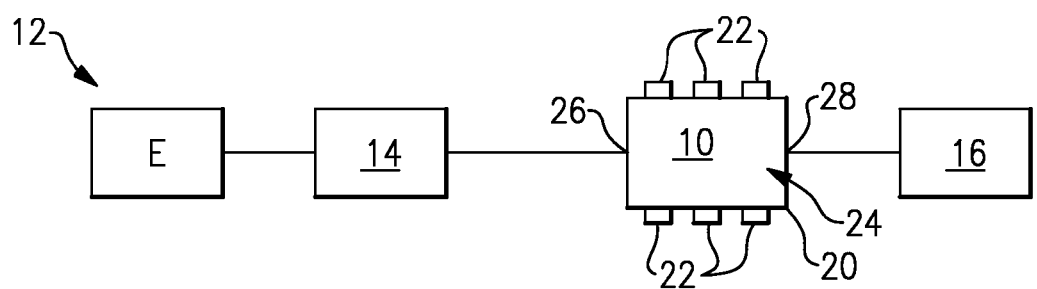
FIG. 1 is a schematic illustration of a vehicle exhaust system with a thermoelectric generator incorporating the subject invention.

A thermoelectric generator 10 for a vehicle exhaust system 12 is shown schematically in FIG. 1. The thermoelectric generator 10 is positioned between an upstream exhaust component 14 and a downstream exhaust component 16. The upstream exhaust component 14 receives exhaust gas that is generated by operation of an internal combustion engine E, for example. The upstream exhaust component 14 can comprise one or more vehicle exhaust components, or can comprise an exhaust manifold of the internal combustion engine E. The downstream exhaust component 16 can comprise one or more vehicle exhaust components such as filters, mufflers, tailpipes, etc.

The thermoelectric generator 10 includes a housing 20 that supports a plurality of thermoelectric modules 22. The housing 20 defines an internal cavity 24 and has an exhaust gas inlet 26 and an exhaust gas outlet 28. The plurality of thermoelectric modules 22 are supported on an external surface of the housing 20. In the example shown, a first set of modules 22 is located on one side of housing 20 and a second set of modules is supported on an opposite side of the housing 20; however, only one set of modules may be required for certain applications.

Exhaust gas flows through the exhaust gas inlet 26 into the internal cavity 24 and then out through the exhaust gas outlet 28. The high temperature of the exhaust gas provides an energy source such that the plurality of thermoelectric modules 22 is able to convert the thermal energy generated by the hot exhaust gases into electric energy.

Any type of thermoelectric module that converts thermal energy to electric power can be used in the thermoelectric generator 10. The operation and structure of such modules is well known and will not be discussed in further detail. Also, the exhaust system may include a bypass arrangement (not shown), which can be controlled to direct all exhaust gas through the generator or to allow exhaust gases to bypass the generator as needed.

Figure 2:
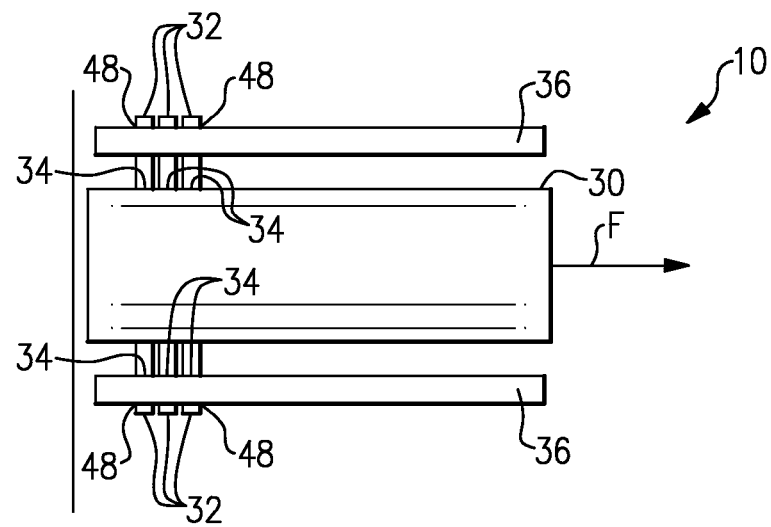
FIG. 2 is a schematic illustration of an exhaust tube and heat extraction components of the thermoelectric generator with a pair of cooling tubes.

In one example configuration shown in FIG. 2, the thermoelectric generator 10 includes at least one exhaust pipe 30 located within the housing 20, and which defines at least a portion of an exhaust gas flow path F through the thermoelectric generator 10. A plurality of heat extraction components 32 are attached to the exhaust pipe 30 and are axially spaced apart from each other along a length of the pipe 30. The heat extraction components can comprise heat transfer fins or other similar structures that extend between the pipe 30 and housing 20, for example. Each heat extraction component 32 includes at least one hole 34 that receives a cooling tube 36. The heat extraction components 32 are configured such that the holes 34 are aligned with each other so that the cooling tube 36 can be easily inserted through the heat extraction components 32. The heat extraction components 32 could also be configured to include multiple holes to receive multiple cooling tubes.

The cooling tubes 36 have an outer peripheral surface 40 and an inner peripheral surface 42 that are radially spaced apart from each other to define a tube wall thickness T. The inner peripheral surface 42 defines a cooling flow path 44 that extends along a length of the cooling tube 36.

A rigid connection interface 48 is formed between each heat extraction component 32 and the cooling tube 36. The rigid connection interface 48 ensures a robust and long lasting thermal contact interface between the cooling tube 36 and the heat extraction components 32.

In one example, the cooling tubes 36 are fitted through the holes 34 and are subsequently brazed to form the rigid connection interface between the tubes 36 and the heat extraction components 32.

In another example shown in FIGS. 3A-3B, the cooling tube 36 is plastically deformed subsequent to being inserted through the holes 34 in the heat extraction components 32. The holes 34 are defined by a diameter D1. The cooling tube 36 has an initial outer diameter D2 and an initial inner diameter D3. The holes 34 are sized such that the hole diameter D1 is greater than the initial outer diameter D2 of the cooling tube 36, i.e. the outer peripheral surface 40 of the cooling tube 36 is spaced from a surface that defines the hole by an initial gap 50. This allows the tubes 36 to be easily inserted through the holes 34.

After the cooling tube 36 is inserted through the aligned holes 34, the tube is then subjected to an expansion operation that increases the initial inner diameter D3 and the initial outer diameter D2 to a final outer diameter D4 and final inner diameter D5 that are greater than the respective initial outer D2 and initial inner D3 diameters of the cooling tube 36. In the expanded state, the final outer diameter D4 of the cooling tube 36 is generally the same as the hole diameter D1 such that a tight fit exists between the heat extraction components 32 and the tube 36, i.e. the initial gap 50 is eliminated. Thus, the cooling tube 36 is plastically deformed to form the rigid connection interface 48 between the cooling tube 36 and the heat extraction components 32 to ensure good thermal contact.

The expansion operation can be accomplished in any of various manners. For example, a hydro-forming process could be utilized where a pressurized fluid is injected inside the cooling tube to radially expand the tube outward into contact with the heat extraction components 32. In another example, a tool can be inserted into the cooling tube to apply a radially outward directed force to plastically deform the tube 36 into contact with the heat extraction components 32. In one example, the tube wall thickness T decreases during the expansion.

By having a rigid connection interface between the heat extraction components and the cooling tube, thermal contact between the components is significantly improved. Further, the rigid connection interface provides this contact in a durable manner that can be maintained over a long period of time.

Although a preferred embodiment of this invention has been disclosed, a worker of ordinary skill in this art would recognize that certain modifications would come within the scope of this invention. For that reason, the following claims should be studied to determine the true scope and content of this invention.

The invention claimed is:

1. A vehicle exhaust component assembly comprising:
   a housing having an external surface and an internal surface defining an internal cavity;
   at least one thermoelectric module attached directly to the housing;
   an exhaust component including at least one exhaust pipe enclosed within the internal cavity of the housing;
   at least one heat extraction component attached directly to the exhaust pipe, the at least one heat extraction component having at least one hole;
   at least one cooling tube received within the at least one hole of the at least one heat extraction component; and
   a rigid connection formed between the at least one heat extraction component and the cooling tube.

2. The vehicle exhaust component assembly according to claim 1 wherein the rigid connection comprises a brazed connection.

3. The vehicle exhaust component assembly according to claim 1 wherein the rigid connection comprises a plastically deformed connection between the at least one heat extraction component and cooling tube.

4. The vehicle exhaust component assembly according to claim 1 wherein the cooling tube has a first outer diameter when inserted into the at least one hole of the at least one heat extraction component, and wherein the cooling tube has a second outer diameter larger than the first outer diameter to form the rigid connection.

5. The vehicle exhaust component assembly according to claim 1 wherein the at least one heat extraction component comprises a plurality of heat extraction components attached to the exhaust pipe.

6. The vehicle exhaust component assembly according to claim 5 wherein the plurality of heat extraction components are axially spaced apart from each other along a length of the exhaust pipe.

7. The vehicle exhaust component assembly according to claim 5 wherein each heat extraction component includes at least one hole that is axially aligned with a hole formed in an adjacent heat extraction component.

8. The vehicle exhaust component assembly according to claim 7 wherein the cooling tube is received within aligned holes of the plurality of heat extraction components, and wherein a rigid connection is formed between each heat extraction component and the cooling tube.

9. The vehicle exhaust component assembly according to claim 1 wherein the exhaust component comprises a thermoelectric generator.

10. The vehicle exhaust component assembly according to claim 9 wherein the at least one heat extraction component is attached to the at least one exhaust pipe within the internal cavity of the housing, and wherein the at least one thermoelectric module is attached to the external surface of the housing and converts thermal energy to electrical power.

11. The vehicle exhaust system according to claim 1 wherein the exhaust pipe defines at least a portion of an exhaust gas flow path through the housing.

12. The vehicle exhaust system according to claim 11 wherein the exhaust pipe includes an outer surface to which the heat extraction component is attached and an inner surface that defines the exhaust gas flow path.

13. The vehicle exhaust system according to claim 12 wherein the at least one heat extraction component comprises a plurality of fins that extend between the exhaust pipe and the internal surface of the housing.

14. The vehicle exhaust system according to claim 12 wherein the at least one heat extraction component comprises a first set of components positioned axially along a first portion of the pipe and a second set of components positioned axially along a second portion of the pipe circumferentially spaced from the first portion.

15. The vehicle exhaust system according to claim 14 wherein the first set of components includes a first set of aligned holes and the second set of components includes a second set of aligned holes, and wherein the at least one cooling tube comprises at least a first cooling tube mounted within the first set of aligned holes and a second cooling tube mounted within the second set of aligned holes.

16. The vehicle exhaust component assembly according to claim 1 wherein the at least one thermoelectric module comprises a plurality of thermoelectric modules that are attached to the external surface of the housing.

17. The vehicle exhaust component assembly according to claim 16 wherein the at least one heat extraction component comprises a plurality of fins extending directly between an outer surface of the exhaust pipe and the internal surface of the housing.

18. The vehicle exhaust component assembly according to claim 17 wherein an inner surface of the exhaust pipe defines an exhaust gas flow path.

19. The vehicle exhaust component assembly according to claim 18 wherein each heat extraction component includes at least one hole that is axially aligned with a hole formed in an adjacent heat extraction component, and wherein the holes are defined by a hole diameter, and wherein the cooling tube has a first outer diameter when inserted into the holes of the heat extraction components, the first outer diameter being less than the hole diameter, and wherein the cooling tube subsequently has a second outer diameter larger than the first outer diameter to form the rigid connection.

20. The vehicle exhaust component assembly according to claim 19 wherein the second outer diameter is at least as great as the hole diameter.

21. The vehicle exhaust component assembly according to claim 1 wherein the housing comprises an outermost component with the at least one thermoelectric module being directly attached to the external surface of the housing.

22. The vehicle exhaust component assembly according to claim 21 wherein the at least one heat extraction component comprises a plurality of fins extending directly between an outer surface of the exhaust pipe and the internal surface of the housing, and wherein each fin includes a hole axially aligned with holes in adjacent fins, the holes configured to receive the at least one cooling tube.

23. The vehicle exhaust component assembly according to claim 22 wherein the rigid connection comprises a plastically deformed connection between the cooling tube and each fin, and wherein the holes are defined by a first diameter and the cooling tube has an initial outer diameter and an initial inner diameter, and wherein the first diameter is greater than the initial outer diameter of the cooling tube, and wherein once the cooling tube is inserted through the holes, the cooling tube expanded to increase the initial inner diameter to a final inner diameter and to increase the initial outer diameter to a final outer diameter, the final inner diameter being greater than the initial inner diameter and the final outer diameter being greater than the initial outer diameter to form the rigid connection interface.

* * * * *